(12) United States Patent
van der Straten et al.

(10) Patent No.: US 10,546,815 B2
(45) Date of Patent: Jan. 28, 2020

(54) LOW RESISTANCE INTERCONNECT STRUCTURE WITH PARTIAL SEED ENHANCEMENT LINER

(71) Applicant: International Business Machines Corporation, Armonk, NY (US)

(72) Inventors: Oscar van der Straten, Guilderland Center, NY (US); Joseph F. Maniscalco, Lake Katrine, NY (US); Koichi Motoyama, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/994,638

(22) Filed: May 31, 2018

(65) Prior Publication Data
US 2019/0371735 A1    Dec. 5, 2019

(51) Int. Cl.
*H01L 23/532* (2006.01)
*H01L 21/768* (2006.01)
*H01L 21/3213* (2006.01)

(52) U.S. Cl.
CPC .. *H01L 23/53238* (2013.01); *H01L 21/32133* (2013.01); *H01L 21/76846* (2013.01); *H01L 21/76847* (2013.01); *H01L 21/76871* (2013.01); *H01L 21/76879* (2013.01); *H01L 21/76882* (2013.01)

(58) Field of Classification Search
CPC ....... H01L 23/53238; H01L 231/32133; H01L 21/76846; H01L 21/76847; H01L 21/76871; H01L 21/76879; H01L 21/76882
See application file for complete search history.

(56) References Cited

U.S. PATENT DOCUMENTS

| | | | |
|---|---|---|---|
| 6,706,625 B1 | 3/2004 | Sudijono et al. | |
| 6,734,097 B2 | 5/2004 | Iggulden et al. | |
| 7,655,564 B2 | 2/2010 | Shinriki et al. | |
| 8,586,473 B1 | 11/2013 | Tanwar et al. | |
| 9,613,907 B2 * | 4/2017 | Hegde | H01L 23/53238 |
| 9,859,215 B1 | 1/2018 | Edelstein et al. | |
| 2003/0003711 A1 | 1/2003 | Modak | |

(Continued)

OTHER PUBLICATIONS

Yang, C.-C., et al., "Characterization of "Ultrathin-Cu"/Ru(Ta)/TaN Liner Stack for Copper Interconnects", IEEE Electron Device Letters, Jul. 2010, pp. 722-724, vol. 31, No. 7.

(Continued)

*Primary Examiner* — Zandra V Smith
*Assistant Examiner* — Andre C Stevenson
(74) *Attorney, Agent, or Firm* — Scully, Scott, Murphy & Presser, P.C.; L. Jeffrey Kelly, Esq.

(57) ABSTRACT

A method which exploits the benefits of a seed enhancement layer (in terms of void-free copper fill), while preventing copper volume loss during planarization, is provided. The method includes forming a partial seed enhancement liner in a lower portion of an opening that contains a recessed copper portion. Additional copper is formed in the upper portion of the opening providing a copper structure in which no copper volume loss at the uppermost interface of the copper structure is observed.

18 Claims, 7 Drawing Sheets

(56) References Cited

U.S. PATENT DOCUMENTS

| | | |
|---|---|---|
| 2012/0161320 A1 | 6/2012 | Akolkar et al. |
| 2015/0179259 A1 | 6/2015 | Kim et al. |
| 2016/0126185 A1* | 5/2016 | Chang .............. H01L 21/76816 438/627 |
| 2016/0163645 A1 | 6/2016 | Kamineni et al. |
| 2017/0133318 A1* | 5/2017 | Chen ................ H01L 21/76862 |

OTHER PUBLICATIONS

Yang, C.-C., et al., "Physical, Electrical, and Reliability Characterization of Ru for Cu Interconnects", International Interconnect Technology Conference, Date of Conference: Jun. 5-7, 2006, pp. 187-190.

* cited by examiner

LOW RESISTANCE INTERCONNECT STRUCTURE WITH PARTIAL SEED ENHANCEMENT LINER

BACKGROUND

The present application relates to an interconnect structure having low line resistance and a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene interconnect structures. The interconnect structures typically include copper, Cu, since Cu based electrically conductive structures embedded in an interconnect dielectric material layer provide higher speed signal transmission between large numbers of transistors on a complex semiconductor chip as compared with aluminum, Al, based electrically conductive structures.

As the Cu based electrically conductive structure feature sizes shrink, it is necessary to scale diffusion barrier thickness in order to minimize the volume of the Cu based electrically conductive structure and to enable low line and via resistance. Scaling sidewall diffusion barrier thickness allows maximization of Cu volume in interconnects and scaling the diffusion barrier thickness at the via bottom allows reduction of via resistance.

For void-free Cu fill at less than 24 nm critical dimension, an additional layer (i.e., a seed enhancement layer) is deposited to prevent diffusion barrier exposure during Cu plating, especially on the sidewalls. One example of a seed enhancement material is ruthenium (Ru). Without a seed enhancement layer, sidewall voids will form which can lead to poor electromigration (EM) performance of the interconnect structure.

Chemical mechanical polishing (CMP) of Cu based electrically conductive structures and Ru seed enhancement layers embedded in an interconnect dielectric material layer is challenging. Specifically, galvanic corrosion of Cu during Ru CMP results in Cu loss at the top interface. This Cu loss is a key contributor to high line resistance. There is thus a need to provide an interconnect structure that includes a seed enhancement layer, while eliminating Cu volume loss during CMP.

SUMMARY

The present application provides a method which exploits the benefits of a seed enhancement layer (in terms of void-free copper fill), while preventing copper volume loss during planarization. The method includes forming a partial seed enhancement liner in a lower portion of an opening that contains a recessed copper portion. Additional copper is formed in the upper portion of the opening providing a copper structure in which no copper volume loss at the uppermost interface of the copper structure is observed.

One aspect of the present application relates to an interconnect structure. In one embodiment, the interconnect structure includes an interconnect dielectric material layer containing an opening. A diffusion barrier liner is located on sidewalls and a bottommost wall of the opening. A partial seed enhancement liner is located on the diffusion barrier liner and present only in a lower portion of the opening. A copper structure is also located in the opening. The copper structure directly contacts a sidewall of the diffusion barrier liner in the upper portion of the opening, and directly contacts a sidewall of the partial seed enhancement liner and a horizontal surface of the diffusion barrier liner in a lower portion of the opening.

Another aspect of the present application relates to a method of forming an interconnect structure. In one embodiment, the method includes providing an opening in an interconnect dielectric material layer. A diffusion barrier layer is then formed on a topmost surface of the interconnect dielectric material layer and in the opening. A seed enhancement liner is formed on sidewalls of the diffusion barrier layer and within the opening. The seed enhancement liner can be formed by first depositing a seed enhancement layer on a topmost surface, and on a sidewall surface and bottommost surface within the opening, after which the seed enhancement layer is removed from a topmost surface as well as from a bottommost surface by a directional etch. Next, a recessed copper portion is formed in the opening. The recessed copper portion protects the seed enhancement liner present on the sidewall in a lower portion of the opening, while leaving the seed enhancement liner in an upper portion physically exposed. The physically exposed seed enhancement liner is then removed from the upper portion of the opening utilizing the recessed copper portion as an etch mask, while maintaining the seed enhancement liner that is present beneath the recessed copper structure. Additional copper is formed within the opening and on the recessed copper structure, and thereafter the additional copper and the diffusion barrier layer that are present outside of the opening and atop the topmost surface of the interconnect dielectric material are removed.

DETAILED DESCRIPTION

Figure 1:
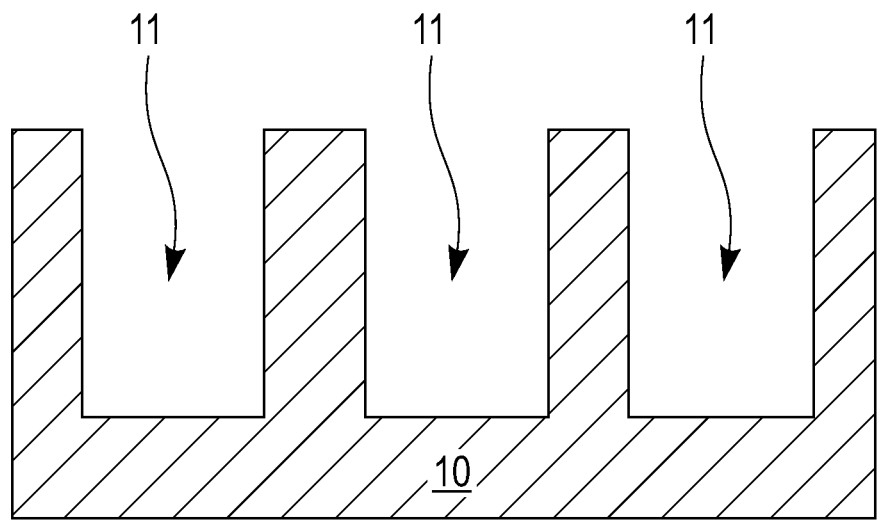
FIG. 1 is a cross sectional view of an exemplary interconnect structure of the present application during an early stage of fabrication and including an interconnect dielectric material layer having at least one opening formed therein.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary interconnect structure of the present application during an early stage of fabrication and including an interconnect dielectric material layer 10 having at least one opening 11 formed therein. Three openings 11 are shown in FIG. 1 by way of one example. The at least one opening 11 may be a via opening, a line opening, or a combined via/line opening.

The interconnect dielectric material layer 10 may be located upon a substrate (not shown in the drawings of the present application). The substrate, which is not shown, may be composed of a semiconductor material, an insulator material, a conductive material or any combination thereof. When the substrate is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, the substrate that is located beneath the interconnect dielectric material layer 10 can be a layered semiconductor such as, for example, Si/SiGe, Si/SiC, silicon-on-insulators (SOIs) or silicon germanium-on-insulators (SGOIs).

When the substrate is an insulator material, the insulator material can be an organic insulator, an inorganic insulator or any combination thereof including multilayers. When the substrate is a conductive material, the substrate may include, for example, polySi, an elemental metal, alloys of elemental metals, a metal silicide, a metal nitride or any combination thereof including multilayers. When the substrate is composed of a semiconductor material, one or more semiconductor devices such as, for example, complementary metal oxide semiconductor (CMOS) devices can be fabricated thereon. When the substrate is composed of a combination of an insulator material and a conductive material, the substrate may represent an underlying interconnect level of a multilayered interconnect structure.

The interconnect dielectric material layer 10 may be composed of any interlevel or intralevel dielectric including inorganic dielectrics or organic dielectrics. In one embodiment, the interconnect dielectric material layer 10 may be non-porous. In another embodiment, the interconnect dielectric material layer 10 may be porous. Some examples of suitable dielectrics that can be used as the interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material layer 10 may vary depending upon the type of dielectric material(s) used. In one example, the interconnect dielectric material layer 10 may have a thickness from 50 nm to 1000 nm. Other thicknesses that are lesser than, or greater than, the aforementioned thickness range may also be employed in the present application for the thickness of the interconnect dielectric material layer 10.

In some embodiments of the present application, a hard mask material (not shown) can be formed on the topmost surface of the interconnect dielectric material layer 10. The hard mask material may be composed of a dielectric oxide, a dielectric nitride and/or a dielectric oxynitride. In one example, the hard mask material may be composed of silicon dioxide or silicon nitride. In another example, the hard mask material may be a hard mask material stack of, in any order, silicon dioxide and silicon nitride. In some embodiments of the present application, the hard mask material may be formed utilizing a deposition process such as, for example, chemical vapor deposition (CVD) or plasma enhanced chemical vapor deposition (PECVD). In other embodiments of the present application, the hard mask material can be formed by a thermal process such as, for example, thermal oxidation and/or thermal nitridation. In yet other embodiments of the present application, the hard mask material can be formed by a combination of a deposition process and a thermal process. The thickness of the hard mask material can be from 10 to 50 nm, although other thicknesses that are lesser than, or greater than the values recited in the present application can be employed as the thickness of the hard mask material.

The at least one opening 11 can be formed utilizing a patterning process. In one embodiment, the patterning process may include lithography and etching. The lithographic process includes forming a photoresist (not shown) atop the hard mask material, if present, and the interconnect dielectric material layer 10, exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening 11. In some embodiments, the etching process includes a first pattern transfer step in which the pattern provided to the photoresist is transferred to the hard mask material providing a patterned hard mask (not shown), the patterned photoresist is then removed by an ashing step, and thereafter, a second pattern transfer step is used to transfer the pattern from the patterned hard mask into the underlying interconnect dielectric material layer 10. The patterned hard mask can be removed utilizing a stripping process after the pattern transfer into the interconnect dielectric material layer 10.

The depth of the at least one opening 11 that is formed into the interconnect dielectric material layer 10 (measured from the topmost surface of the interconnect dielectric material layer 10 to the bottom wall of the at least one opening 11) may vary. In some embodiments (not shown), the at least one opening 11 may extend entirely through the interconnect dielectric material layer 10. In yet other embodiments (and as illustrated in FIG. 1), the at least one opening 11 stops within the interconnect dielectric material layer 10 itself. In yet further embodiments, different depth openings 11 can be formed into the interconnect dielectric material layer 10.

Figure 2:
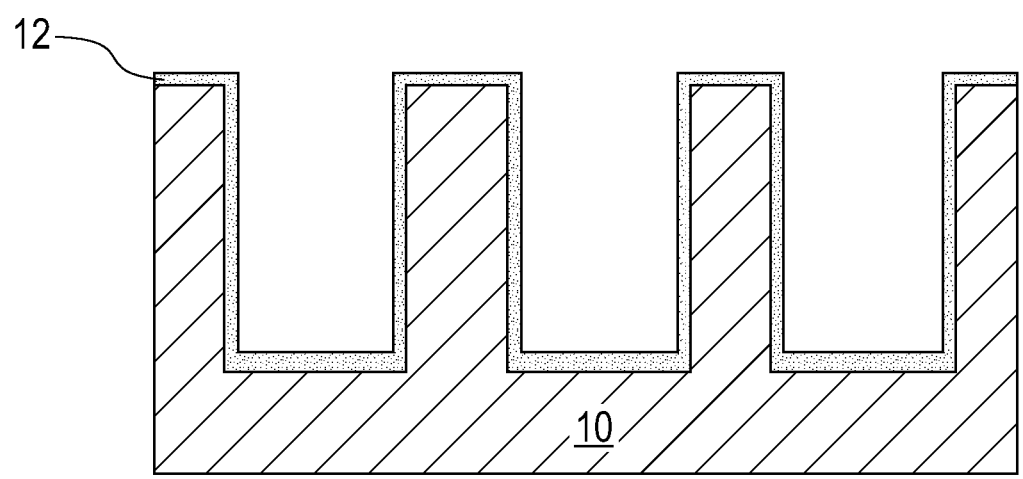
FIG. 2 is a cross sectional view of the exemplary interconnect structure of FIG. 1 after forming a diffusion barrier layer on a topmost surface of the interconnect dielectric material layer, and lining sidewalls and a bottommost wall of each opening.

Referring now to FIG. 2, there is illustrated the exemplary interconnect structure of FIG. 1 after forming a diffusion barrier layer 12 on a topmost surface of the interconnect dielectric material layer 10, and lining sidewalls and the bottommost wall of each opening 11.

The diffusion barrier layer 12 is a continuous layer that is composed of a diffusion barrier material (i.e., a material that can serve as a barrier to prevent a conductive material such as copper from diffusing there through). Exemplary diffusion barrier materials that can be used in providing the diffusion barrier layer 12 include Ta, TaN, Ti, TiN, Ru, RuN, RuTa, RuTaN, W, or WN. In some embodiments, the diffusion barrier layer 12 may include a material stack of such diffusion barrier materials. In one example, the diffusion barrier layer 12 may be composed of a stack of Ta/TaN.

The thickness of the diffusion barrier layer 12 may vary depending on the deposition process used as well as the material employed. In some embodiments, the diffusion barrier layer 12 may have a thickness from 2 nm to 50 nm; although other thicknesses for the diffusion barrier layer 12 are contemplated and can be employed in the present application as long as the diffusion barrier layer 12 does not entirely fill in the at least one opening 11. The diffusion barrier layer 12 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 3:
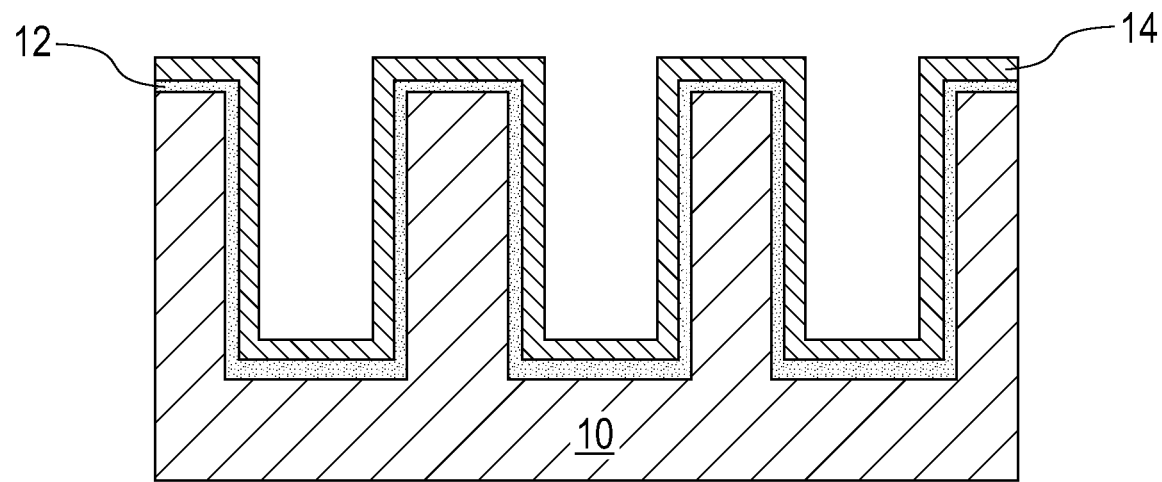
FIG. 3 is a cross sectional view of the exemplary interconnect structure of FIG. 2 after forming a seed enhancement layer on the diffusion barrier layer.

Referring now to FIG. 3, there is illustrated the exemplary interconnect structure of FIG. 2 after forming a seed enhancement layer 14 on the diffusion barrier layer 12. The seed enhancement layer 14 is a continuous material that is compositionally different from the diffusion barrier layer 12. The seed enhancement layer 14 may be composed of metal or metal alloy having a low resistivity, and that is nobler than copper or a copper alloy. By "nobler" it is meant that the metal or metal alloy that provides the seed enhancement layer 14 is more resistant to corrosion and oxidation in moist air than copper or a copper alloy. By "low resistivity" it is meant a bulk resistivity of 20 micro-Ohm-cm or less. Examples of metals that may be employed as the seed enhancement layer 14 include, but are not limited to, ruthenium (Ru), rhodium (Rh), or palladium (Pd). Examples of metal alloys that may be employed as the seed enhancement layer 14 include a Ru—Rh or Ru—Pd alloy. In one embodiment, the diffusion barrier layer 12 is composed of TaN and the seed enhancement layer 124 is composed of ruthenium.

The thickness of the seed enhancement layer 14 may vary depending on the deposition process used as well as the material employed. In some embodiments, the seed enhancement layer 14 may have a thickness from 2 nm to 50 nm; although other thicknesses for the seed enhancement layer 14 are contemplated and can be employed in the present application as long as the seed enhancement layer 14 does not entirely fill in the at least one opening 11. The seed enhancement layer 14 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
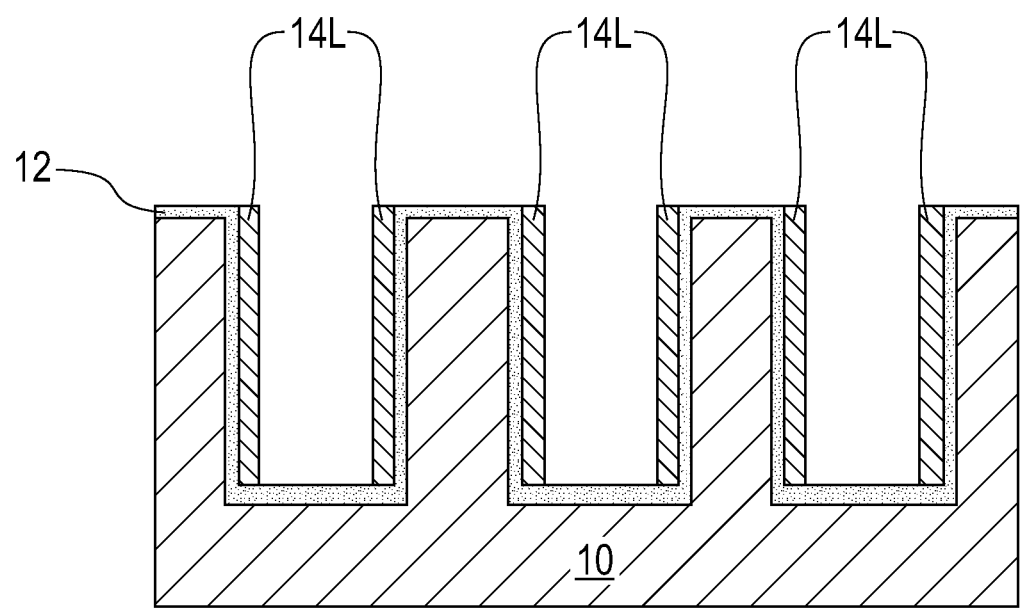
FIG. 4 is a cross sectional view of the exemplary interconnect structure of FIG. 3 after removing the seed enhancement layer from all horizontal surfaces to provide a seed enhancement liner.

Referring now to FIG. 4, there is illustrated the exemplary interconnect structure of FIG. 3 after removing the seed enhancement layer 14 from all horizontal surfaces to provide a seed enhancement liner 14L in each opening 11. The removal of the seed enhancement layer 14 from all horizontal surfaces of the structure (including the topmost surface of the interconnect dielectric material layer 10 and the bottommost surface of the opening 11) may include a directional etching process such as, for example, a sputter etch.

Figure 5:
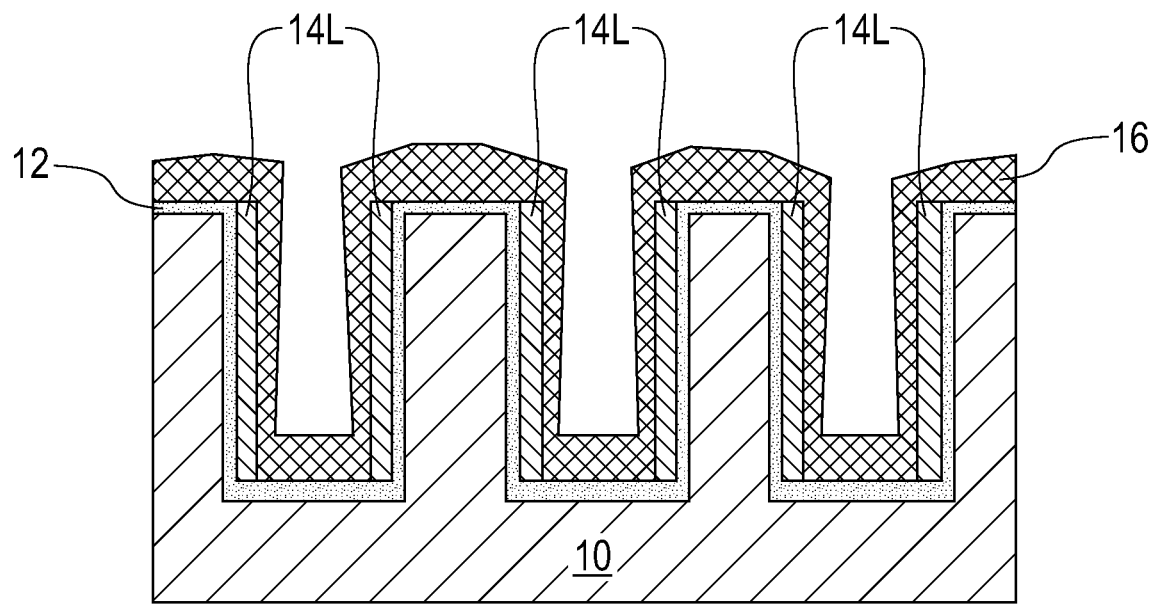
FIG. 5 is a cross sectional view of the exemplary interconnect structure of FIG. 4 after forming a copper seed layer.

Referring now to FIG. 5, there is illustrated the exemplary interconnect structure of FIG. 4 after forming a copper seed layer 16. The copper seed layer 16 is formed on physically exposed surfaces of the seed enhancement liner 14L and the diffusion barrier layer 12. The copper seed layer 16 is not needed in all instances.

The copper seed layer 16 is employed to selectively promote subsequent formation of a copper layer 18. The copper seed layer 16 is typically composed of Cu or a Cu alloy. The thickness of the copper seed layer 16 may vary depending on the material of the optional plating seed layer as well as the technique used in forming the same. Typically, the copper seed layer 16 has a thickness from 2 nm to 80 nm. The copper seed layer 16 can be formed by a conventional deposition process including, for example, CVD, PECVD, ALD, or PVD.

Figure 6:
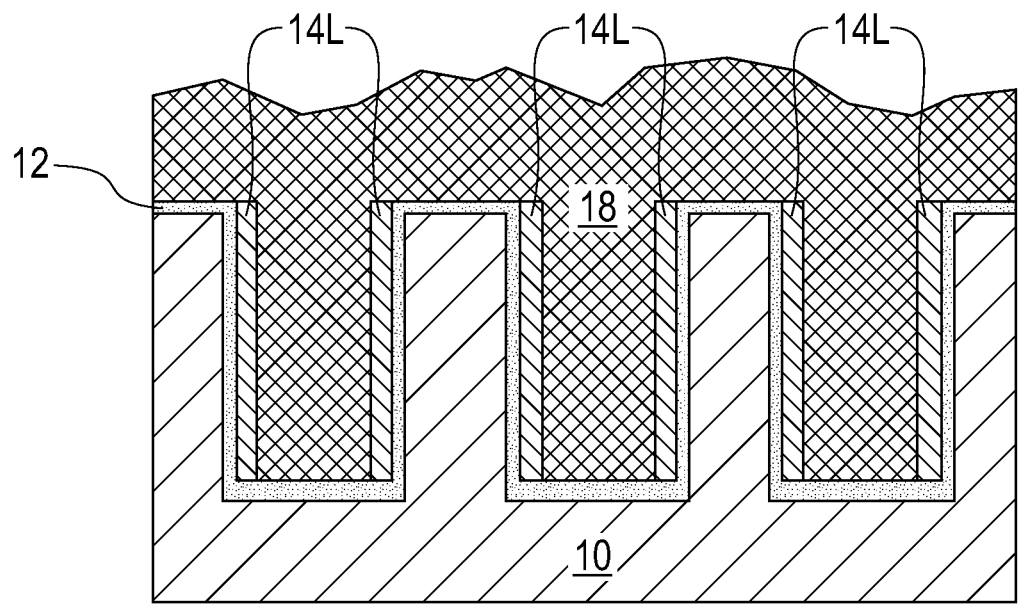
FIG. 6 is a cross sectional view of the exemplary interconnect structure of FIG. 5 after forming a copper layer.

Referring now to FIG. 6, there is illustrated the exemplary interconnect structure of FIG. 5 after forming a copper layer 18; the copper seed layer 16 provides a portion of copper layer 18. The copper layer 18 may be composed of copper or a copper alloy. In some embodiments, the copper layer 18 can be formed utilizing a deposition process such as, for example, CVD, PECVD, sputtering, chemical solution deposition or plating. In one example, a bottom-up plating process is employed in copper layer 18.

In some embodiments, a reflow anneal may follow the deposition of the copper layer 18. In one embodiment, the reflow anneal is a thermal anneal. In one example, the reflow anneal may include a furnace anneal or a hot plate anneal. The reflow anneal may be performed at a temperature from 100° C. to 500° C. Other temperatures can also be employed so long as the selected reflow anneal temperature causes the reflow of the interconnect metal or metal alloy. The duration of the reflow anneal may vary depending upon the temperature used during the thermal anneal. In one embodiment and for a temperature from 100° C. to 500° C., the reflow anneal may be performed for a duration of 20 minutes to 3 hours. The reflow anneal is typically performed in a nitrogen-containing ambient or a hydrogen-containing ambient.

As is shown, the copper layer 18 fills in a remaining volume of each opening 11 and the copper layer 18 includes an upper portion (overburden portion) that extends outside of each opening 11 and atop the topmost surface of the interconnect dielectric material layer 10.

Figure 7:
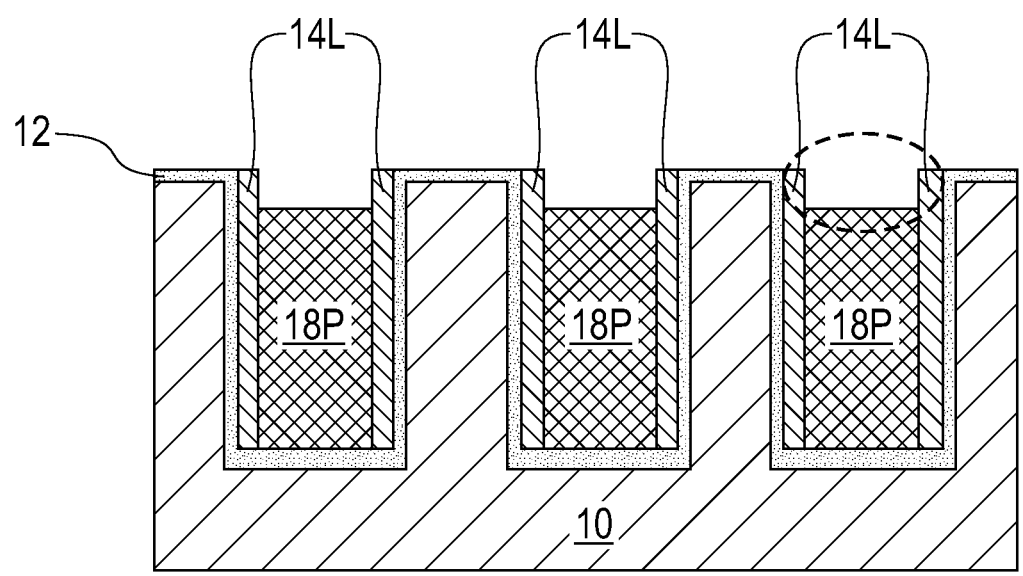
FIG. 7 is a cross sectional view of the exemplary interconnect structure of FIG. 6 after performing a planarization process to remove the copper layer that is located outside each of the openings and above the topmost surface of the interconnect dielectric material.

Referring now to FIG. 7, there is illustrated the exemplary interconnect structure of FIG. 6 after performing a planarization process to remove the copper layer 18 that is located outside each of the openings 11 and above the topmost surface of the interconnect dielectric material 10. That is, the planarization process removes the overburden portion of the copper layer 18. The planarization process includes chemical mechanical polishing (CMP).

Ideally the planarization process would only remove the overburden portion of the copper layer 18, and provide a copper structure that has a topmost surface that is coplanar with a topmost surface of the seed enhancement line 14L. However, and due to the galvanic corrosion of Cu in the presence of the seed enhancement liner 14L, the remaining copper layer within the opening 11 (hereinafter referred to as a copper portion 18P) has an undesired recess associated therewith. See, the dotted circle region shown in FIG. 7. This copper loss at the top interface is undesired since it is a key contributor to high line resistance within an interconnect structure.

Figure 8:
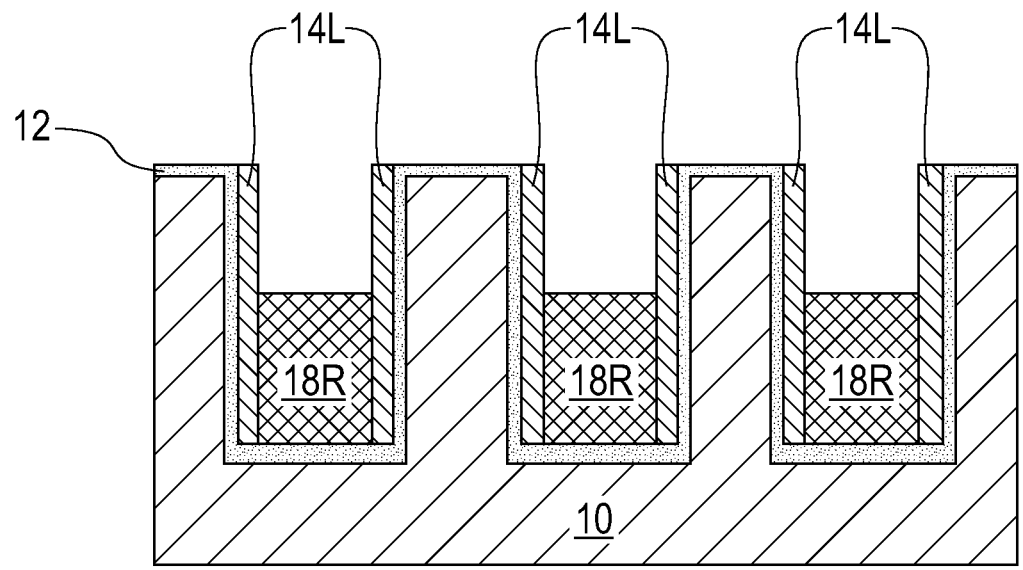
FIG. 8 is a cross sectional view of the exemplary interconnect structure of FIG. 7 after recessing the copper layer that remains in each opening.

Referring now to FIG. 8, there is illustrated the exemplary interconnect structure of FIG. 7 after recessing the copper layer (i.e., the copper portions 18P) that remains in each opening 11. Each recessed copper portion is designated as element 18R in the drawings. The recessing of the copper portions 18P may be performed utilizing an etching process that is selective in removing copper or a copper alloy. Each recessed copper portion 18R has a topmost surface that is beneath the topmost surface of the interconnect dielectric material layer 10. The recessing of the copper portions 18P physically exposes a portion of the seed enhancement liner 14L that is present in an upper portion of each opening 11. The recessed copper portions 18R protect a portion of the seed enhancement liner 14L that is present in a lower portion of each opening 11.

Figure 9:
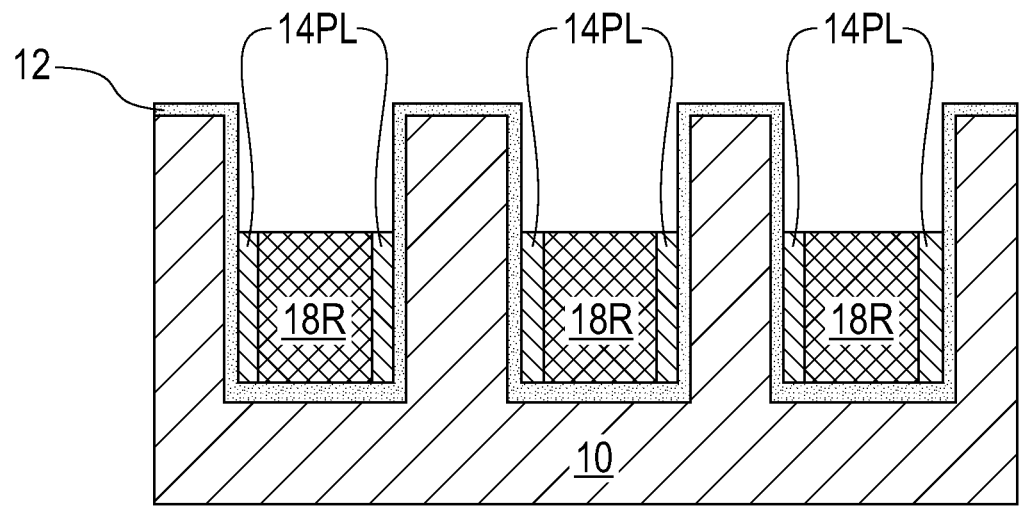
FIG. 9 is a cross sectional view of the exemplary interconnect structure of FIG. 8 after recessing the seed enhancement liner to provide a partial seed enhancement liner in a bottom portion of each of the openings.

Now referring to FIG. 9, there is illustrated the exemplary interconnect structure of FIG. 8 after recessing the seed enhancement liner 14L to provide a partial seed enhancement liner 14PL in a bottom portion of each of the openings 11. This recessing step removes the entirety of the physically exposes portion of the seed enhancement liner 14L that is present in an upper portion of each opening 11. The partial seed enhancement liner 14PL that is protected by the recessed copper portion 18R is present in a lower portion of each opening 11. The recessing of the seed enhancement liner 14L includes an etching process that is selective in removing the material that provides the seed enhancement liner 14L, and the recessed copper portions 18R is utilized as an etch mask.

Figure 10:
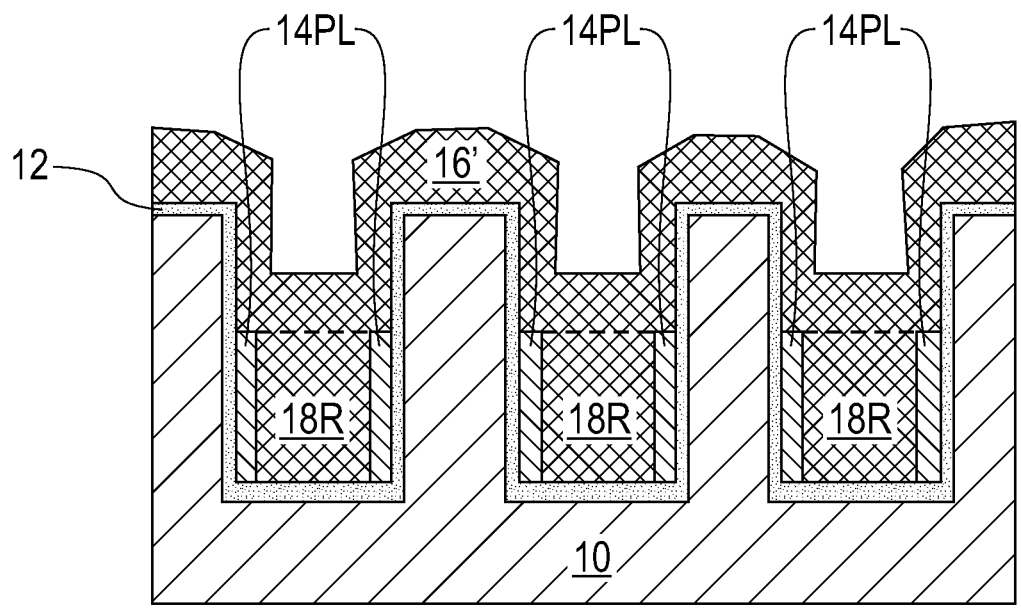
FIG. 10 is a cross sectional view of the exemplary interconnect structure of FIG. 9 after forming another copper seed layer.

Referring now to FIG. 10, there is illustrated the exemplary interconnect structure of FIG. 9 after forming another copper seed layer 16'. In some instances, no another copper seed layer 16' is employed. The another copper seed layer 16' is the same as copper seed layer 16 mentioned above. The another copper seed layer 16' can be formed utilizing one of the deposition processes mentioned above in forming copper seed layer 16. In the drawings, a dotted line is used to distinguish the recessed copper portion 18R from the another copper seed layer 16'. In reality no interface would exist between the recessed copper portion 18R and the another copper seed layer 16'.

Figure 11:
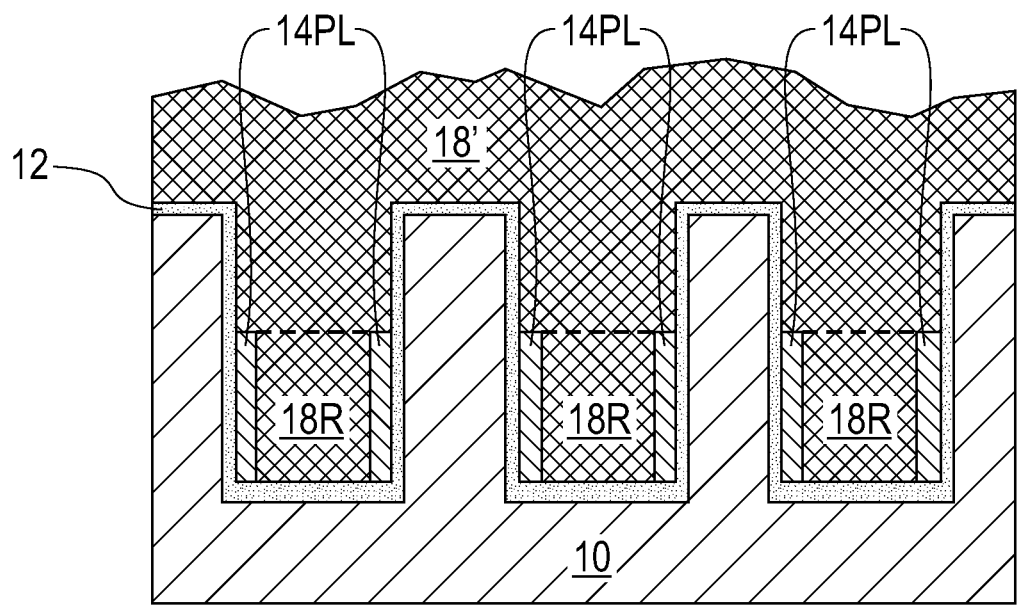
FIG. 11 is a cross sectional view of the exemplary interconnect structure of FIG. 10 after forming another copper layer.

Referring now to FIG. 11, there is illustrated the exemplary interconnect structure of FIG. 10 after forming another copper layer 18'. The another copper layer 18' is the same as copper layer 18 mentioned above. The another copper layer 18' can be formed utilizing one of the processes mentioned above in forming copper layer 18. In the drawings, a dotted line is used to distinguish the recessed copper portion 18R from the another copper layer 18'. In reality no interface would exist between the recessed copper portion 18R and the another copper layer 18'.

Figure 12:
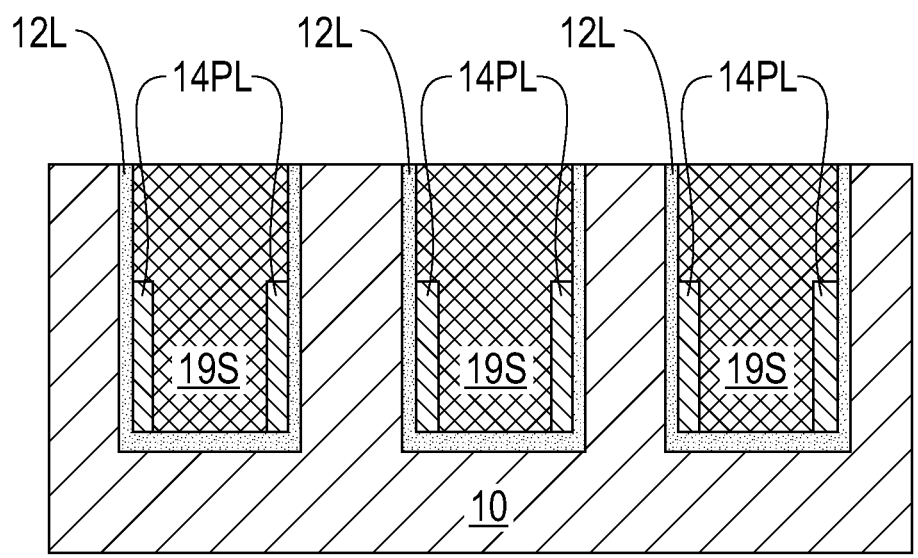
FIG. 12 is a cross sectional view of the exemplary interconnect structure of FIG. 11 after performing a planarization process which stops on the topmost surface of the interconnect dielectric material layer.

Referring now to FIG. 12, there is illustrated the exemplary interconnect structure of FIG. 11 after performing a planarization process which stops on the topmost surface of the interconnect dielectric material layer 10. The planarization process includes CMP and removes the overburden portion of the another copper layer 18' as well as the diffusion barrier layer 14 that is present outside the opening 11 and atop the topmost surface of the interconnect dielectric material 12. The remaining portion of the another copper layer 18' and the recessed copper portion 18R that remain in each opening may be referred to herein as a copper structure 19S. The remaining diffusion barrier layer 14 in the opening is referred to herein as a diffusion barrier liner 12L. The copper structure 19S and the diffusion barrier liner 12L have a topmost surface that is coplanar with a topmost surface of the interconnect dielectric material layer 10. No copper recess occurs in the exemplary structure shown in FIG. 12 since no seed enhancement liner is present at the upper interface of the copper structure 19S that could cause galvanic corrosion of copper. The interconnect structure shown in FIG. 12 is reliable, and has a low line resistance.

Notably, FIG. 12 illustrates an exemplary interconnect structure that includes an interconnect dielectric material layer 10 containing an opening 11. A diffusion barrier liner 12L is located on sidewalls and a bottommost wall of the opening. A partial seed enhancement liner 14PL is located on the diffusion barrier liner 12L and present only in a lower portion of the opening 11. A copper structure 19S is also located in the opening 11. The copper structure 19S directly contacts a sidewall of the diffusion barrier liner 12L in the upper portion of the opening 11, and directly contacts a sidewall of the partial seed enhancement liner 14PL and a horizontal surface of the diffusion barrier liner 12L in a lower portion of the opening 11. No void and/or recess is present in the copper structure 19S. In the exemplary structure, the partial seed enhancement liner 14PL is buried beneath the topmost surface of the copper structure 19S.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
   an interconnect dielectric material layer containing an opening;
   a diffusion barrier liner located on sidewalls and a bottommost wall of the opening;
   a partial seed enhancement liner located on the diffusion barrier liner and present only in a lower portion of the opening, wherein the partial seed enhancement liner is composed of ruthenium (Ru), rhodium (Rh), palladium (Pd) or an alloy thereof and is more nobler than copper or a copper alloy; and
   a copper structure located in the opening, wherein the copper structure is in direct physical contact with a sidewall of the diffusion barrier liner in the upper portion of the opening, and in direct physical contact with both a sidewall of the partial seed enhancement liner and a horizontal surface of the diffusion barrier liner in a lower portion of the opening.

2. The interconnect structure of claim 1, wherein the copper structure has a topmost surface that is coplanar with a topmost surface of the interconnect dielectric material layer.

3. The interconnect structure of claim 2, wherein the partial seed enhancement liner has a topmost surface that is located beneath the topmost surface of the interconnect dielectric material layer.

4. The interconnect structure of claim 2, wherein the topmost surface of the copper structure is coplanar with a topmost surface of the diffusion barrier liner.

5. The interconnect structure of claim 1, wherein the partial seed enhancement liner has a bulk resistivity of 20 micro-Ohm-cm or less.

6. The interconnect structure of claim 5, wherein the partial seed enhancement liner is composed of ruthenium (Ru), rhodium (Rh), palladium (Pd) or an alloy thereof.

7. The interconnect structure of claim 1, wherein diffusion barrier liner is composed of a different material than the partial seed enhancement liner.

8. The interconnect structure of claim 7, wherein the diffusion barrier liner is composed of TaN and the partial seed enhancement liner is composed of ruthenium.

9. The interconnect structure of claim 1, wherein no void and/or recess is present in the copper structure.

10. A method of forming an interconnect structure, the method comprising:
    providing an opening in an interconnect dielectric material layer;
    forming a diffusion barrier layer on a topmost surface of the interconnect dielectric material layer and in the opening;
    forming a seed enhancement liner composed of ruthenium (Ru), rhodium (Rh), palladium (Pd) or an alloy thereof and is more nobler than copper or a copper alloy on sidewalls of the diffusion barrier layer and within the opening, wherein the forming of the seed enhancement liner comprises forming a seed enhancement layer on the diffusion barrier layer, and performing a directional etch to remove the seed enhancement layer from horizontal surfaces of the structure including a horizontal surface of the diffusion barrier layer that is present in a lower portion of the opening;
    forming a recessed copper portion in the opening and directly contacting the horizontal surface of the diffusion barrier layer that is physically exposed in the lower portion of the opening, wherein the recessed copper portion protects the seed enhancement liner present in the lower portion of the opening, while leaving the seed enhancement liner in an upper portion physically exposed;
    removing the physically exposed seed enhancement liner from the upper portion of the opening utilizing the recessed copper portion as an etch mask, while maintaining the seed enhancement liner that is present beneath the recessed copper structure;
    forming additional copper within the opening and on the recessed copper structure; and
    removing the additional copper and the diffusion barrier layer that are present outside of the opening and atop the topmost surface of the interconnect dielectric material.

11. The method of claim 10, wherein the forming of the recessed copper portion comprises:
    forming a copper seed layer;
    forming a copper layer having an overburden portion that extends outside of the opening and atop the topmost surface of the interconnect dielectric material;
    removing the overburden portion of the copper layer by chemical mechanical polishing, wherein during the chemical mechanical polishing a copper portion is provided; and
    recessing the copper portion.

12. The method of claim 11, wherein the copper portion has an undesired copper recess region formed by galvanic corrosion of copper.

13. The method of claim 10, wherein the removing of the physically exposed seed enhancement liner from the upper portion of the opening comprises a selective etching process.

14. The method of claim 10, wherein the forming of the additional copper comprises:
    forming an additional copper seed layer; and
    forming an additional copper layer.

15. The method of claim 10, wherein the seed enhancement liner has a bulk resistivity of 20 micro-Ohm-cm or less.

16. The method of claim 10, wherein the seed enhancement liner is composed of ruthenium (Ru), rhodium (Rh), palladium (Pd) or an alloy thereof.

17. The method of claim 10, wherein the diffusion barrier layer is composed of TaN and the seed enhancement liner is composed of ruthenium.

18. The method of claim 10, wherein the forming of the recessed copper portion and the additional copper includes deposition of copper or a copper alloy, and performing a reflow anneal.

* * * * *